(12) United States Patent
Kund

(10) Patent No.: US 6,674,627 B1
(45) Date of Patent: Jan. 6, 2004

(54) NEEDLE-CARD ADJUSTING DEVICE FOR PLANARIZING NEEDLE SETS ON A NEEDLE CARD

(75) Inventor: Michael Kund, München (DE)

(73) Assignee: Infineon Technologies AG, Munich (DE)

( * ) Notice: Subject to any disclaimer, the term of this patent is extended or adjusted under 35 U.S.C. 154(b) by 232 days.

(21) Appl. No.: 09/705,599

(22) Filed: Nov. 3, 2000

(30) Foreign Application Priority Data

Nov. 3, 1999 (DE) .......................................... 199 52 943

(51) Int. Cl.⁷ .............................................. H01H 47/00
(52) U.S. Cl. ...................... 361/143; 324/72.5; 324/765; 324/754; 324/758
(58) Field of Search ........................ 324/754, 757–758, 324/72.5, 765; 361/143

(56) References Cited

U.S. PATENT DOCUMENTS

| 3,963,985 | A | | 6/1976 | Geldermans |
| 5,410,259 | A | * | 4/1995 | Fujihara et al. .............. 324/758 |
| 5,422,574 | A | * | 6/1995 | Kister .......................... 324/754 |
| 5,804,983 | A | * | 9/1998 | Nakajima et al. ........... 324/758 |
| 5,861,759 | A | | 1/1999 | Bialobrodski et al. |

FOREIGN PATENT DOCUMENTS

DE   25 44 735 A1   6/1976

* cited by examiner

*Primary Examiner*—Brian Sircus
*Assistant Examiner*—Isabel Rodriguez
(74) *Attorney, Agent, or Firm*—Laurence A. Greenberg; Werner H. Stemer; Ralph E. Locher

(57) ABSTRACT

A needle-card adjusting device for planarizing needle sets on a needle card, in which the needle card is connected to a circuit board used as a contact interface to a test head. The needle-card adjusting device has a separate, dynamically operating adjusting unit for adjusting the needle-card.

10 Claims, 2 Drawing Sheets

NEEDLE-CARD ADJUSTING DEVICE FOR PLANARIZING NEEDLE SETS ON A NEEDLE CARD

BACKGROUND OF THE INVENTION

FIELD OF THE INVENTION

The present invention relates to a needle-card adjusting device for planarizing needle sets on a needle card (also referred to as a probe card) in relation to a wafer with which contact is to be made, in which the needle card is connected to a circuit board used as a contact interface to a test head.

Published, Non-Prosecuted German Patent Application DE 25 44 735 A1 discloses a test-head carrier with the aid of which the distance between individual test heads which carry test tips can be adjusted. This is intended to achieve adaptation of the test heads to the various shrinkages of ceramic substrates.

Furthermore, U.S. Pat. No. 5,861,859 describes an automatic planarizing system for test cards, in which a test card is adjusted with respect to a wafer surface. In which, first, three tips on the test card, of which two can be varied vertically, are aligned with the wafer surface.

As is known, needle sets on needle cards produce the electrical connection between individual contact pads or points on chips and a test head, in order in this way to check the serviceability of the chips on the wafer. In this wafer, the planarizing of the needle sets on the needle card in relation to the wafer with which contact is to be made, or the chips contained in the latter, becomes more and more complicated with the increasing number of the chips with which contact is to be made simultaneously. This is because the needle sets must be adjusted precisely to the contact pads respectively assigned to them on the chips, down to the order of magnitude of ¼ μm.

At the same time, it is to be noted that, in addition to the static adjustment of the needle card relative to the chips, dynamic components also have to be taken into account, these being caused, for example, by thermal expansion of the needle card during heating up or cooling down via a wafer holding device, also referred to as a "chuck". Other dynamic components can be traced back to aging effects of the needle cards, on which the needle sets are mostly adhesively bonded. However, the dynamic components can also have very short time constants, such as in the case of vibrations.

In the case of needle sets that are adhesively bonded to the needle card, these have previously not been adjusted or have been adjusted only by a subsequent bending of each individual needle, which results in a considerable expenditure in time and money with the required accuracy down to ¼ μm. If the needle sets are fitted to so-called space transformers, then they can be adjusted with the aid of simple screws, with which, however, the indicated accuracy can barely be achieved.

SUMMARY OF THE INVENTION

It is accordingly an object of the invention to provide a needle-card adjusting device for planarizing needle sets on a needle card which overcomes the above-mentioned disadvantages of the prior art devices of this general type, with which the needle sets on the needle card can readily be planarized in relation to a wafer with which contact is to be made.

With the foregoing and other objects in view there is provided, in accordance with the invention, a combination of a needle card assembly having a needle-card with a plurality of needle sets, a test head, and a circuit board functioning as a contact interface to the test head, with a needle-card adjusting device for planarizing the needle sets on the needle card in relation to a wafer with which contact is to be made. The needle-card adjusting device includes a separate, dynamically operating adjusting unit connecting the needle card to the circuit board.

In the case of the needle-card adjusting device of the type mentioned at the beginning, according to the invention the object is achieved by the needle card being connected to the circuit board via a separate, dynamically operating adjusting unit. The adjusting unit is preferably constructed from at least one piezoelectric element. However, it can also contain a multiplicity of piezoelectric elements, which act on the needle card in the edge region thereof.

With the needle-card adjusting device according to the invention, the planarity of the needle card can readily be produced on site by dynamic adjustment. Therefore maladjustments of the needle card, which has been brought about for example by thermal expansion of the needle card or by brief vibration, can readily be corrected. Because of the dynamic adjustability of the needle card, the parallelism between the needle card and the wafer can be corrected when contact is made via the wafer edge.

Since, using the separate, dynamically operating adjusting unit, via which the needle card is connected to the circuit board, even dynamic effects can readily be corrected, any requirement for additional adjusting devices is dispensed with. In addition, the adjustment can be performed with the aid of a contact test loop, that is to say a program for the verification of the contact between each needle and an associated pad.

The adjusting unit can act in directions that are essentially perpendicular to the plane covered by the needle-card surface and/or in directions that are essentially in this plane.

As a result of constructing the adjusting unit from piezoelectric elements, in particular, its adjustability can be implemented with high precision.

In accordance with an added feature of the invention, there is provided a sense line, an active line, and a control unit connected to the dynamically operating adjusting unit through the sense line and the active line for controlling the dynamically operating adjusting unit.

In accordance with a concomitant feature of the invention, there is provided a stiffening device disposed between the needle card and the dynamically operating adjusting unit.

Other features which are considered as characteristic for the invention are set forth in the appended claims.

Although the invention is illustrated and described herein as embodied in a needle-card adjusting device for planarizing needle sets on a needle card, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
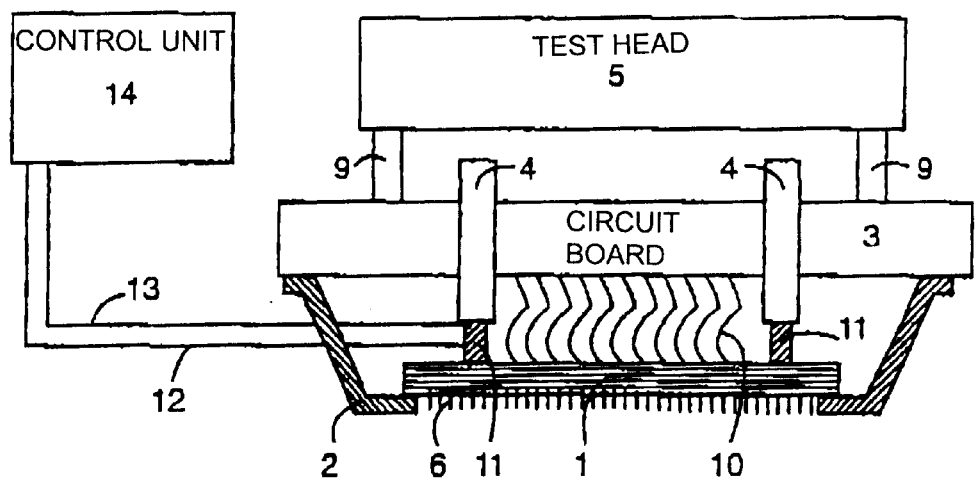
FIG. 1 is a diagrammatic, side-elevational view of a first exemplary embodiment of a needle-card adjusting device according to the invention.

In all the figures of the drawing, sub-features and integral parts that correspond to one another bear the same reference symbol in each case. Referring now to the figures of the drawing in detail and first, particularly, to FIG. 1 thereof, there is shown a needle card or probe card 1, which is mounted by screws 4 between a circuit board 3 and a window in a stiffening device 2. In this case, the circuit board 3 is used as a contact interface to a test head 5, with the aid of which test signals can be supplied to individual needles 6 on the needle card 1.

Figure 2:
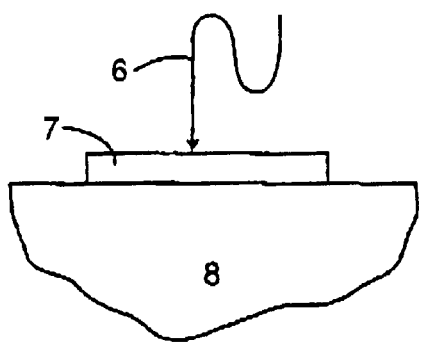
FIG. 2 is a diagrammatic, partial, side-elevational view of a needle making contact with a pad on a chip.

FIG. 2 shows the structure of such a needle 6, the needle 6 here making contact with a pad 7 on a chip 8 of a wafer.

The electrical connection between the test head 5 and the circuit board 3 is indicated by connecting buses 9, while connecting wires 10 are led between the circuit board 3 and the individual needles 6.

The screws 4 constitute a mechanical adjusting unit, since their rotation can be used to effect approximate parallelism between the needle card 1 and a surface of the chip 8 with which contact is made by the needles 6.

According to the invention, in addition to the screws 4, piezoelectric elements 11 are also provided, which are in each case connected to a control unit 14 via a sense line 12 and an active line 13. If a misalignment between the needles 6 on the needle card 1 and the wafer surface is determined by the piezoelectric elements 11, the misalignment is reported to the control unit 14 via the sense line 12. In the control unit 14, for example a computer 14, the corrections necessary to compensate for the misalignment are calculated, in order then to output appropriate signals via the active line 13 to the piezoelectric elements 11.

Of course, all the piezoelectric elements 11 are connected to the control unit 14 via corresponding lines 12, 13, although, in FIG. 1, this is shown for only one piezoelectric element 11, for improved clarity.

Instead of piezoelectric elements, other components permitting dynamic adjustment can also be used.

The lines 12, 13 form, together with the control unit 14, a contact test loop, with the aid of which the desired adjustment can be performed by appropriate dilation or contraction of the piezoelectric elements 11.

After adjustment has been carried out, the zero position of the needle card 1 can be set by the screws 4, so that the piezoelectric elements 11 only need to perform readjustments.

Figure 3:
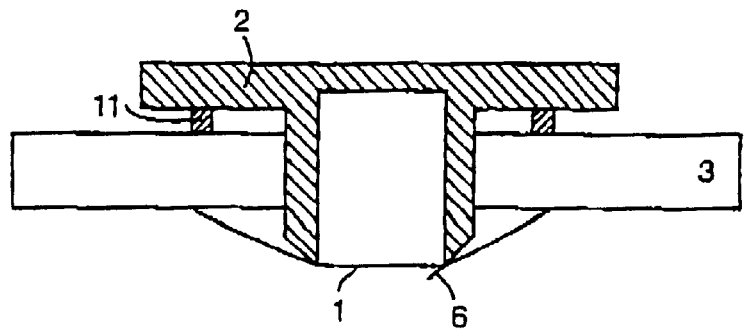
FIG. 3 is a side-elevational view of a second exemplary embodiment of the needle-card adjusting unit.

FIG. 3 shows a further exemplary embodiment of the invention, in which the needle card 1 with a set of the needles 6 is placed in a window in the stiffening device 2. Here, the piezoelectric elements 11 are disposed between the stiffening device 2 and the circuit board 3, so that the adjustment has to be performed merely via the piezoelectric elements 11 and not via additional screws 4.

Otherwise, the exemplary embodiment of FIG. 3 is constructed in the same way as the exemplary embodiment of FIG. 1: here, too, the piezoelectric elements 11 are connected to the control unit 14 via the corresponding lines 12, 13 (not shown separately in FIG. 3).

Figure 4:
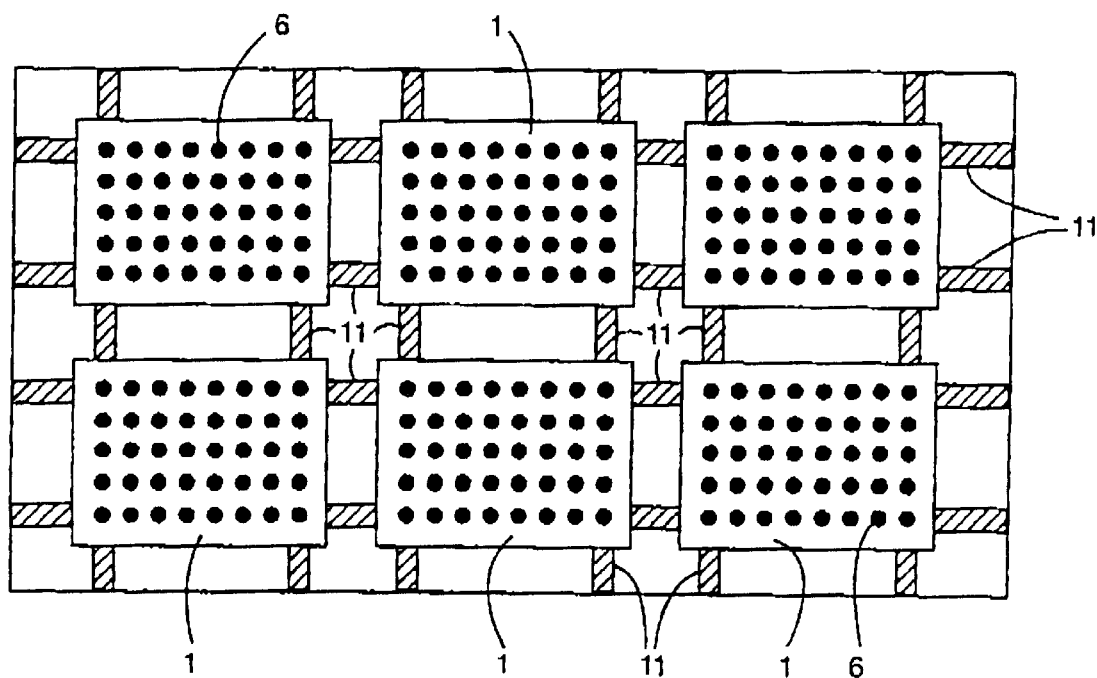
FIG. 4 is a plan view of a number of needle-card sets in a needle-card adjusting unit according to a fourth exemplary embodiment of the invention.

FIG. 4 shows an exemplary embodiment having a configuration formed of a number of the needle cards 1 which are fitted in a fixed frame acting as the stiffening device 2 and can be displaced laterally with respect to the frame 2 and with respect to one another by the piezoelectric elements 11.

Such laterally acting piezoelectric elements 11 can also readily be combined with the vertically acting piezoelectric elements 11 of FIGS. 1 and 3 if they are fitted in a suitable way, for example, in FIG. 1, between the stiffening device 2 and the needle card 1.

I claim:

1. In combination with a needle card assembly having a needle-card with a plurality of needle sets, a test head, and a circuit board functioning as a contact interface to the test head, a needle-card adjusting device for planarizing the needle sets on the needle card in relation to a wafer with which contact is to be made, the needle-card adjusting device comprising:

a separate, dynamically operating adjusting unit connecting the needle card to the circuit board;

a sense line;

an active line; and a control unit connected to said dynamically operating adjusting unit through said sense line and said active line for controlling said dynamically operating adjusting unit.

2. The needle-card adjusting device according to claim 1, wherein said dynamically operating adjusting unit is formed of at least one piezoelectric element.

3. The needle-card adjusting device according to claim 1, wherein said dynamically operating adjusting unit is formed of a multiplicity of piezoelectric elements which act on an edge region of the needle card.

4. The needle-card adjusting device according to claim 1, including a stiffening device disposed between the needle card and said dynamically operating adjusting unit.

5. The needle-card adjusting device according to claim 1, wherein the needle-card has a surface, and said dynamically operating adjusting unit acts in directions which are at least one of substantially perpendicular to a plane covered by the surface of the needle-card and in further directions which are substantially in said plane.

6. A needle-card assembly, comprising:

a needle-card having a plurality of needles for making contact with a wafer;

a test head;

a circuit board functioning as a contact interface with said test head;

a dynamically operating adjusting unit connecting said circuit board to said needle-card so that said needles are planarized with respect to the wafer;

a sense line;

an active line; and a control unit connected to said dynamically operating adjusting unit through said sense line and said active line for controlling said dynamically operating adjusting unit.

7. The needle-card assembly according to claim 6, wherein said dynamically operating adjusting unit is formed of at least one piezoelectric element.

8. The needle-card assembly according to claim 6, wherein said at dynamically operating adjusting unit is formed from a multiplicity of piezoelectric elements acting on an edge region of said needle-card.

9. The needle-card assembly according to claim 6, including a stiffening device disposed between said needle-card and said dynamically operating adjusting unit.

10. The needle-card assembly according to claim 6, wherein said needle-card has a surface, and said dynamically operating adjusting unit acts in directions which are at least one of substantially perpendicular to a plane covered by said surface of said needle-card and in further directions which are substantially in said plane.

* * * * *